(12) United States Patent
Koizumi et al.

(10) Patent No.: US 7,605,415 B2
(45) Date of Patent: Oct. 20, 2009

(54) IMAGE PICKUP DEVICE COMPRISING PHOTOELECTRIC CONVERSATION UNIT, FLOATING DIFFUSION REGION AND GUARD RING

(75) Inventors: Toru Koizumi, Kanagawa-Ken (JP); Seiichiro Sakai, Kanagawa-Ken (JP); Masanori Ogura, Kanagawa-Ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/146,131

(22) Filed: Jun. 7, 2005

(65) Prior Publication Data

US 2005/0269604 A1    Dec. 8, 2005

(30) Foreign Application Priority Data

Jun. 7, 2004    (JP)    ............... 2004-168575

(51) Int. Cl.
H01L 31/062    (2006.01)
(52) U.S. Cl. ............... 257/291; 257/292; 257/E27.133
(58) Field of Classification Search ............. 257/291, 257/E31.057, E27.133, 292
See application file for complete search history.

(56) References Cited

U.S. PATENT DOCUMENTS

| | | | | |
|---|---|---|---|---|
| 6,252,286 | B1 * | 6/2001 | Arai ........................ | 257/446 |
| 6,403,998 | B1 * | 6/2002 | Inoue ....................... | 257/292 |
| 6,433,374 | B1 * | 8/2002 | Fukunaga et al. .......... | 257/292 |
| 2003/0137594 | A1 * | 7/2003 | Koizumi et al. ........... | 348/308 |
| 2003/0160295 | A1 | 8/2003 | Okita ....................... | 257/506 |
| 2006/0027843 | A1 | 2/2006 | Ogura ...................... | 257/290 |
| 2006/0043393 | A1 | 3/2006 | Okita ....................... | 257/93 |
| 2006/0043439 | A1 | 3/2006 | Koizumi ................... | 257/292 |
| 2006/0043440 | A1 | 3/2006 | Hiyama et al. ............. | 257/291 |
| 2006/0044434 | A1 | 3/2006 | Okita ....................... | 348/243 |
| 2006/0044439 | A1 | 3/2006 | Hiyama et al. ............. | 348/294 |

FOREIGN PATENT DOCUMENTS

JP    10-308507    11/1998

* cited by examiner

*Primary Examiner*—Thanh V Pham
*Assistant Examiner*—Mohammad T Karimy
(74) *Attorney, Agent, or Firm*—Fitzpatrick, Cella, Harper & Scinto

(57) ABSTRACT

The present invention uses an image pickup device comprising a plurality of pixels respectively including a photoelectric conversion unit for converting incoming light into a signal charge, an amplifying unit for amplifying the signal charge generated by the photoelectric conversion unit and a transfer unit for transferring the signal charge from the photoelectric conversion unit to the amplifying unit, in which the photoelectric conversion unit is formed of a first-conductivity-type first semiconductor region and a second-conductivity-type second semiconductor region and a second-conductivity-type third semiconductor region is formed on at least a part of the gap between a photoelectric conversion unit of a first pixel and a photoelectric conversion unit of a second pixel adjacent to the first pixel, a first-conductivity-type fourth semiconductor region having an impurity concentration higher than that of the first semiconductor region is formed between the photoelectric conversion unit and the third semiconductor region and a first-conductivity-type fifth semiconductor region formed at a position deeper than the fourth semiconductor region and having an impurity concentration higher than that of the first semiconductor region is included between the photoelectric conversion unit and the third semiconductor region.

5 Claims, 17 Drawing Sheets

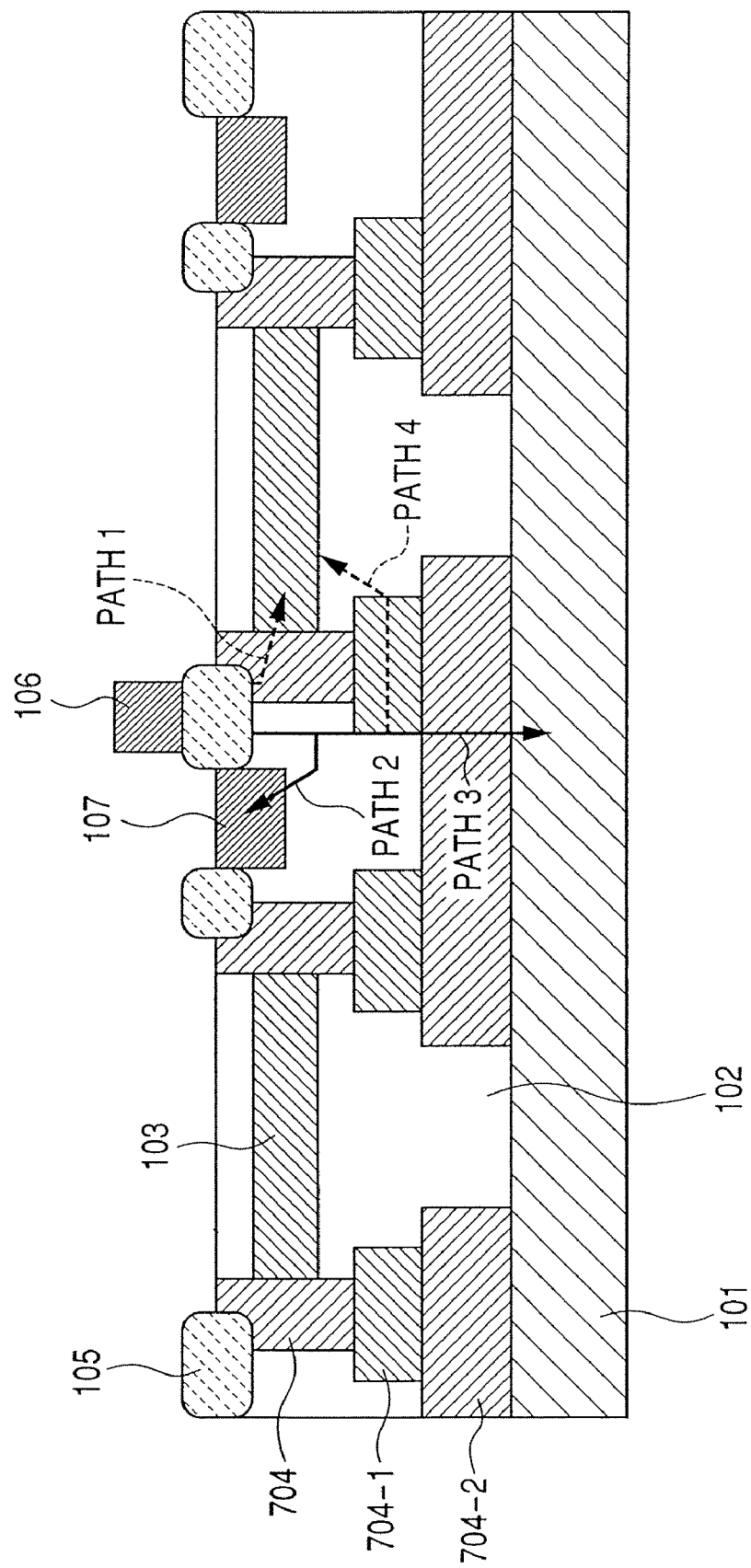

IMAGE PICKUP DEVICE COMPRISING PHOTOELECTRIC CONVERSATION UNIT, FLOATING DIFFUSION REGION AND GUARD RING

BACKGROUND OF THE INVENTION

1. Field of the Invention

The present invention relates to an image pickup device for converting an image to an electrical signal, and more particularly, to an active pixel sensor (hereafter referred to as APS) having an amplifier for each pixel or several pixels.

2. Related Background Art

An image pickup device serving as an APS is also referred to as a CMOS sensor and widely used for digital cameras. This conventional image pickup device is described below by referring to FIGS. 9 to 12.

FIG. 9 is a top layout drawing pf pixels of a conventional image pickup device.

FIG. 10 is a cross-sectional structural drawing along the line 10-10 in FIG. 9.

FIG. 11 is a concentration profile along the line Y-Y in FIG. 10.

FIG. 12 is an equivalent circuit diagram using the image pickup device in FIG. 9.

In FIG. 12, reference numeral 121 denotes a photodiode (PD) for converting light into a signal charge and 122 and others denote a processing circuit for driving a PD or processing the signal charge of the PD 121. Reference numeral 122 denotes a transfer MOS transistor for transferring a signal charge generated by a photodiode, 123 denotes a floating diffusion (FD) region for temporarily storing the transferred signal charge, 124 denotes a resetting MOS transistor for resetting the floating diffusion region 123 and PD 121, 125 denotes a source follower MOS transistor for converting the signal charge of the floating diffusion region 123 into a voltage and amplifying the voltage by a source follower amplifier, 126 denotes a selection MOS transistor for selecting an optional one row in an array and 127 denotes a read line commonized by one column to read a pixel voltage signal. Pixels are arranged like an array to constitute an image pickup device.

In FIGS. 9 and 10, a PD of a photoelectric conversion unit is constituted of a P-type well region (hereafter referred to as "PWL") 102 and a PN junction in an N region 103 on an N-type substrate 101. Reference numeral 107 denotes an N+ region serving as a source-drain region of a source follower MOS transistor which is a part of a circuit for amplifying a signal charge generated by a PD.

In the case of the APS of a prior art, the N region 103 of a PD serving as a photoelectric conversion unit is one of large sources for respectively generating a dark current. A dark current component generated nearby a separation layer 105 on the fringe of the N region 103 is present in addition of a component generated on the entire surface of the N region 103. Therefore, the N region 103 of the PD is separated from the separation layer 105 which is a generation region of the dark current component by a certain distance. A P+ region (channel stop region) 104 having a high P-type impurity concentration is formed between the separation layer 105 and the N region of the PD in order not to make a depletion layer extending from the N region 103 of the PD reach the separation layer. An example of the configuration is disclosed in Japanese Patent Application Laid-Open No. H10-308507. Moreover, in U.S. 2003160295A, it is reported that a dark current is extremely generated under a poly-wiring on a separation layer. The channel stop region 104 raises a P-type concentration of a channel stop region under a separation layer in which a poly-wiring (or poly-gate) 106 is set and realizes an effect for restraining a dark current by forming a concentration barrier on a path to the N region 103.

However, even by forming the channel stop region, when deepening a concentration profile of a PWL and using a PWL structure for improving a quantum efficiency of photoelectric conversion by a PD, a new technical problem is found that a dark current increases.

Specifically, as shown in FIG. 11, a dark current increases at a rate of more than 10% by changing a concentration profile of $PWL_1$ 102-1 to $PWL_2$ 102-2. Moreover, by setting a profile of $PWL_3$ 102-3, the dark current increases at a rate of tens of percents. This is a phenomenon which cannot be explained by a conventional idea that a dark current is generated because a depletion layer contacts with a separation layer. Moreover, when a well is deepened, a problem further occurs that the number of charges leaked from adjacent pixels increases. Specifically, a problem of deterioration of a blooming phenomenon or color mixture occurs.

Therefore, it is an object of the present invention to greatly restrain a dark current, blooming and color mixture when the concentration profile of the PWL is deep and a PWL structure for improving a quantum efficiency of photoelectric conversion by a PD is used.

SUMMARY OF THE INVENTION

To solve the above problems, an amplifying type image pickup device of the present invention comprises a plurality of pixels each having a photoelectric conversion unit, a plurality of amplifying elements each provided for one or more photoelectric conversion units, and a MOS transistor for reading signals from the photoelectric conversion units, the pixels being arranged on a second-conductivity-type semiconductor substrate, wherein the photoelectric conversion unit comprises a first-conductivity-type first semiconductor region and a second-conductivity-type second semiconductor region so as to form a PN junction between the first and second semiconductor regions, an element isolation region formed by an insulator for isolating the photoelectric conversion unit from an element adjacent to the photoelectric conversion unit is arranged, a second-conductivity-type third semiconductor region forming an electrode region of the MOS transistor through the element isolation region is arranged between first and second ones of the photoelectric conversion units adjacent to each other, a wiring for controlling a gate potential of the MOS transistor is arranged on the element isolation region arranged between the first one of the photoelectric conversion units and third semiconductor region, a first-conductivity-type fourth semiconductor region having an impurity concentration higher than the impurity concentration of the first semiconductor region and a first-conductivity-type fifth semiconductor region arranged deeper than the fourth semiconductor region with reference to an element forming plane of the semiconductor substrate are arranged under the element isolation region adjacent to the first one of the photoelectric conversion units, and the fifth semiconductor region has an impurity concentration higher than an impurity concentration of the first semiconductor region, and a width larger than a width of the fourth semiconductor region, and the third semiconductor region is disposed within a sixth semiconductor region of an impurity concentration lower than impurity concentration of the fourth and fifth semiconductor regions.

In addition, an amplification type image pickup device of the present invention comprises a plurality of pixels each having a photoelectric conversion units, a plurality of amplifying elements each provided for one or more photoelectric conversion unit and a MOS transistor for reading signals from the photoelectric conversion units, the pixels being arranged on a second-conductivity-type semiconductor substrate, wherein the photoelectric conversion unit comprises a first-conductivity-type first semiconductor region and a second-conductivity-type second semiconductor region so as to form a PN junction between the first and second semiconductor regions, an element isolation region formed by an insulator for isolating the photoelectric conversion unit from an element adjacent to the photoelectric conversion unit is arranged, a second-conductivity-type third semiconductor region forming an electrode region of the MOS transistor through the element isolation region is arranged between first and second ones of the photoelectric conversion units adjacent to each other, a first-conductivity-type fourth semiconductor region having an impurity concentration higher than the impurity concentration of the first semiconductor region and a first-conductivity-type fifth semiconductor region arranged deeper than the fourth semiconductor region with reference to an element forming plane of the semiconductor substrate are arranged under the element isolation region adjacent to the first one of the photoelectric conversion units, and wherein the third semiconductor region is arranged in a first-conductivity-type sixth semiconductor region having an impurity concentration lower than the impurity concentration of the fourth and fifth semiconductor regions.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 7 is a sectional structural view of pixels of the image pickup device of the Embodiment 2;

The accompanying drawings, which are incorporated in and constitute a part of the specification, illustrate embodiments of the invention and, together with the description, serve to explain the principles of the invention.

DESCRIPTION OF THE PREFERRED EMBODIMENTS

First, the principle and means of the present invention are described below in detail. As a result of earnestly studying the above problems, the present inventor et al. found the following solving means.

Figure 10:
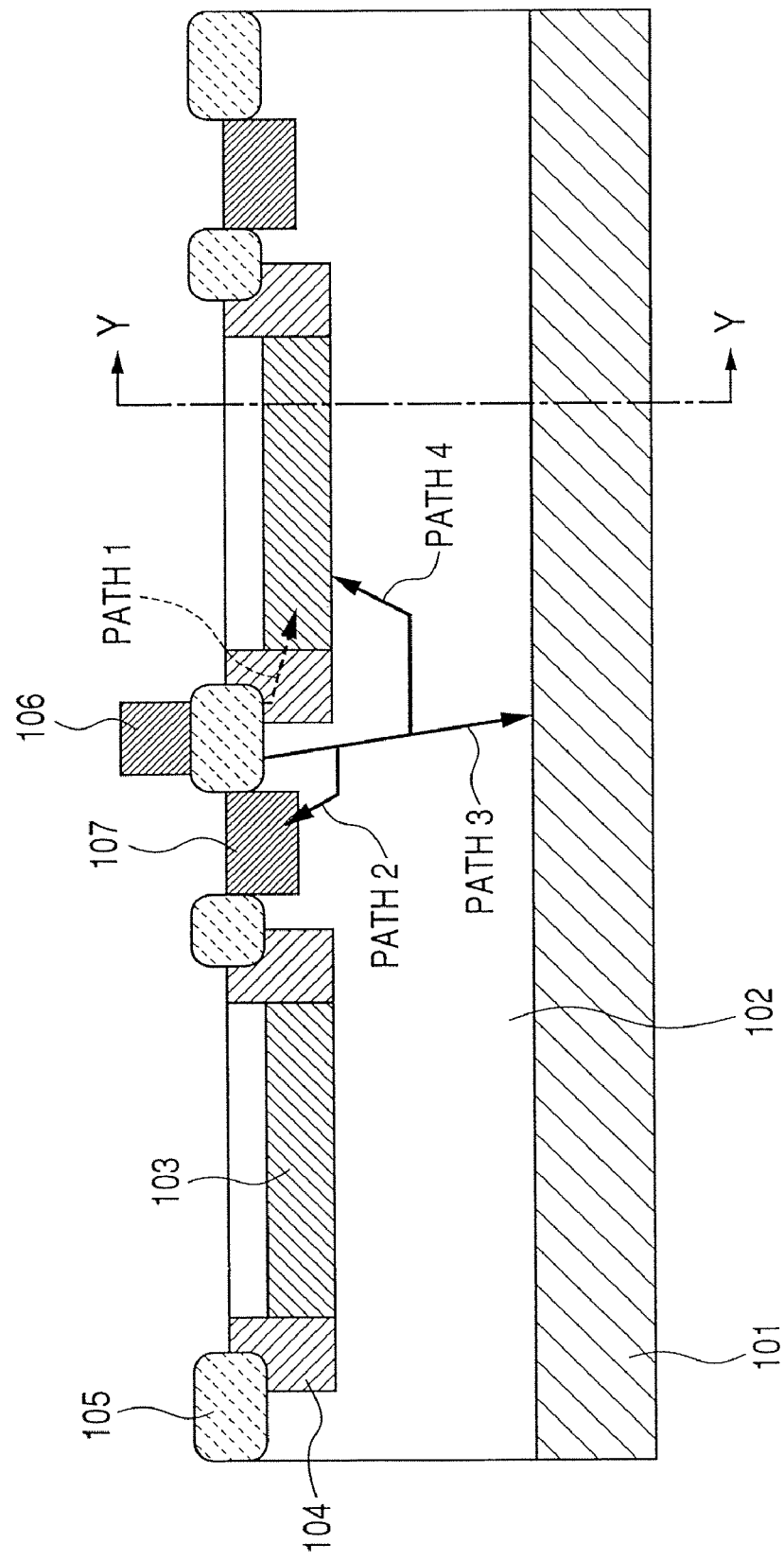
FIG. 10 is a sectional structural view along the line 10-10 in FIG. 9.

It is useful to set the above P-type semiconductor region for channel stop slightly separately from a separation layer at the MOS transistor side because the impurity concentration of the region is high. When the P-type semiconductor region is formed by contacting with the separation layer at the MOS transistor side, a narrow channel phenomenon occurs, the effective channel width of the MOS transistor decreases and it is difficult to form a fine pixel. Therefore, a region free from P-type semiconductor region is left even under the poly-wiring 106 as shown in FIG. 10 due to the problem of the layout. Conventionally, it has been considered that most of the current generated in this region is discharged to the N+ region 107 of the MOS transistor by passing through the path 2. However, it is found that some of the current is discharged to the N-type substrate 101 by the path 3 and some of the current is discharged to the N region 103 of the PD by passing through the downside of the P-type semiconductor region. Particularly, in the case of a PWL structure having a deep concentration profile, a relation between a PWL structure and a dark current that the dark current is increased by a path 4 is found.

More minute description is made. For example, among electrons generated in the poly-wiring 106, 100 (unit is optional) flow through paths 3 and 4 other than the path 2. This component is superimposed on the dark current component generated on the entire surface. However, in the case of the concentration profile of $PWL_2$ 102-2, 80 flows through the path 3 and remaining 20 flows through the path 4. As a result, the dark current component increases. In the case of the structure of $PWL_3$ 102-3, however, because a concentration barrier is formed in a deep portion, the path 3 is greatly decreased and as a result, the path 4 may increase up to approx. 50.

Therefore, in the case of an image pickup device of the present invention having a plurality of pixels including a photoelectric conversion unit for converting incoming light into a signal charge, an amplifying unit for amplifying the signal charge generated by the photoelectric conversion unit and a transfer unit for transferring the signal charge from the photoelectric conversion unit to the amplifying unit, the photoelectric conversion unit is formed of a first-conductivity-type first semiconductor region, and a second-conductivity-type second semiconductor region, a second-conductivitytype third semiconductor region is formed on at least a part of the portion between the photoelectric conversion unit of a first pixel and the photoelectric conversion unit of a second pixel adjacent to the first pixel, a first-conductivity-type fourth semiconductor region having an impurity concentration higher than that of the first semiconductor region is formed between the photoelectric conversion unit and the third semiconductor region and formed at a position deeper than the fourth semiconductor region between the photoelectric conversion unit and the third semiconductor region, and a first-conductivity-type fifth semiconductor region having an impurity concentration higher than that of the first semiconductor region is included.

In this case, "deep" is a degree of a distance from a principal plane serving as a photoreceiving surface of an image pickup device to another principal plane facing the former principal plane. Moreover, "horizontal direction" is a direction orthogonal to the depth direction.

Hereafter, specific embodiments of the present invention are described. However, a portion common to that of a conventional device is provided with a same symbol.

Embodiment 1

Figure 1:
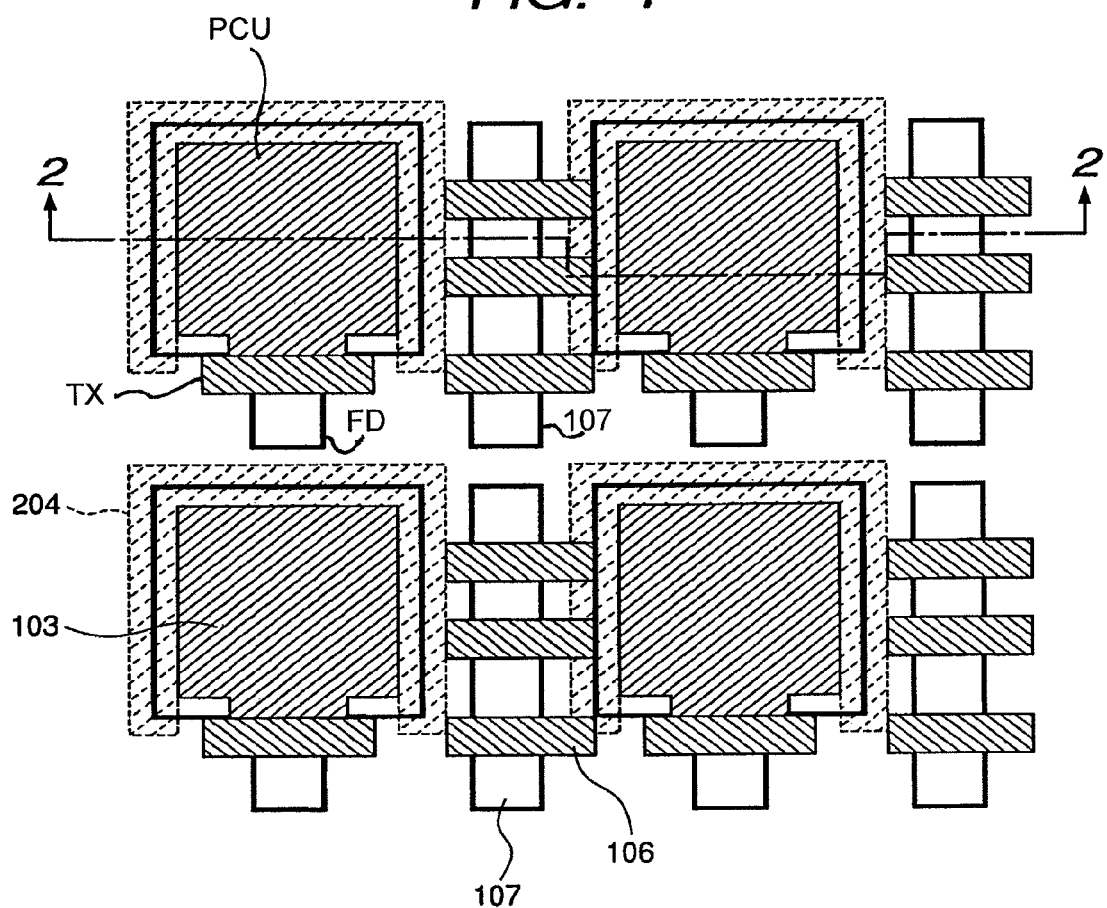
FIG. 1 is a top layout view of pixels of an image pickup device of Embodiment 1 of the present invention.

FIG. 1 is a top layout view of pixels of the image pickup device of the Embodiment 1 of the present invention.

Figure 2:
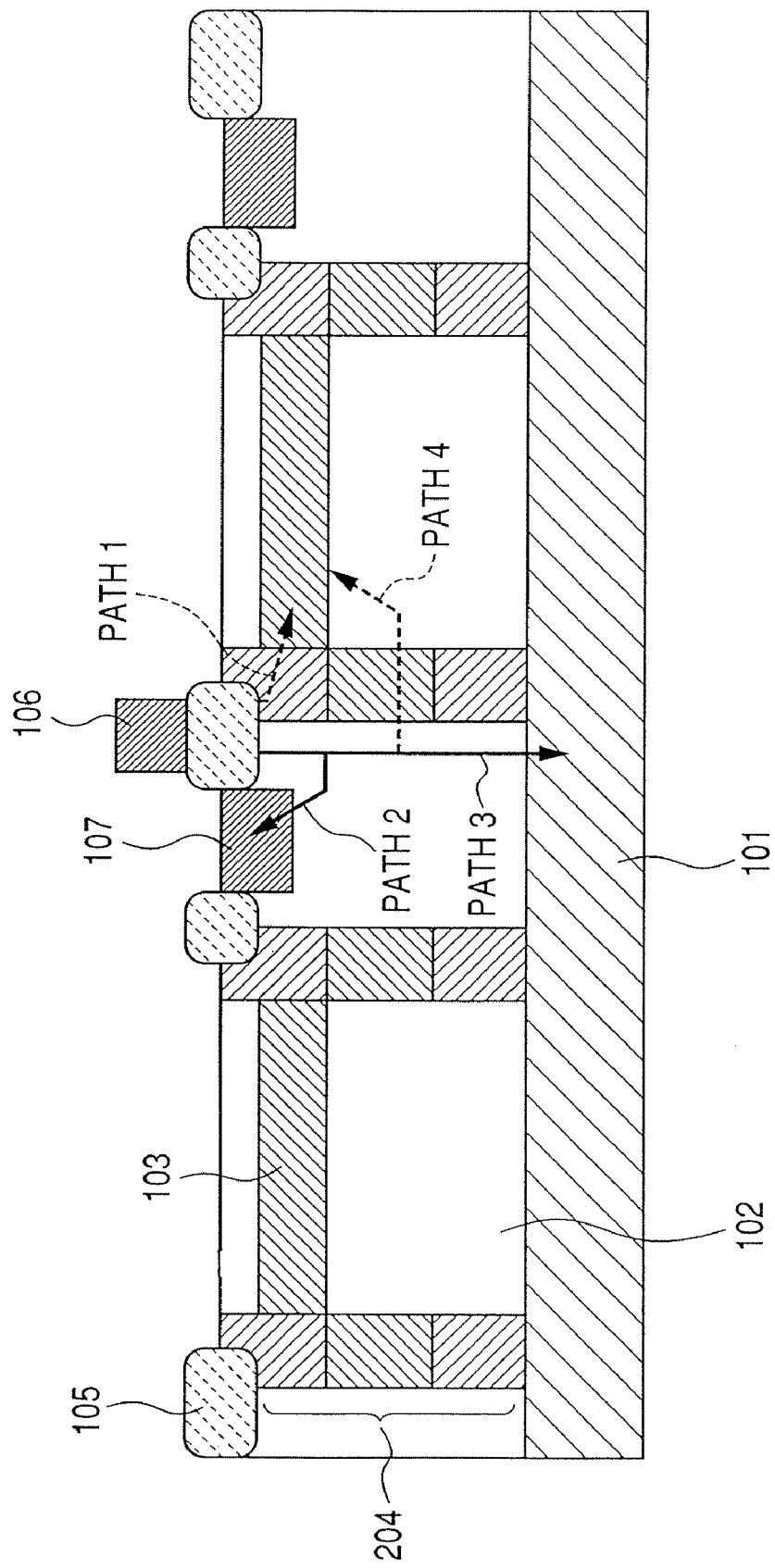
FIG. 2 is a sectional structural view along the line 2-2 in FIG. 1 of the present invention.

FIG. 2 is a sectional structural view along the line 2-2 in FIG. 1.

In FIG. 2, reference numeral 204 denotes a P-type semiconductor region (P+ guard layer) peculiar to the Embodiment 1.

As shown in FIG. 2, the present invention greatly decreases the dark current in accordance with a model for generating the dark current by using the following structure. As such configuration, (1) the P-type semiconductor region 204 is made to extend up to a position nearby the N-type substrate 101. Moreover, it is allowed to use a structure including at least a second P-type semiconductor region 204-2 at a position deeper than a first P-type semiconductor region 204-1. Furthermore, it is allowed to include a third P-type semiconductor region 204-3.

Furthermore, a configuration is used in which (2) the N+ region 107 is formed between the semiconductor region 204 and the semiconductor region 204 of an adjacent pixel. The N+ region 107 is an N+ region serving as a source-drain region of a source-follower MOS transistor or the like used for amplification of a signal charge. In this case, an amplifying unit is formed between pixels.

In this case, a P-type semiconductor region and N+ region are used. However, it is enough that a P-type semiconductor region is an impurity region having a conductivity type reverse to that of the region shown by 103 for forming a photoelectric conversion unit and storing charges. Moreover, it is enough that an N+ region is an impurity region having a conductivity type reverse to that of the impurity region. In this case, in FIG. 1, a plurality of pixels (2×2=4 pixels in FIG. 1) are formed.

The structure of (1) restrains a flow to the path 4 in FIG. 2 and the structure of (2) accelerates a flow to the path 2 to resultantly decrease the flow to the path 4.

Figure 11:
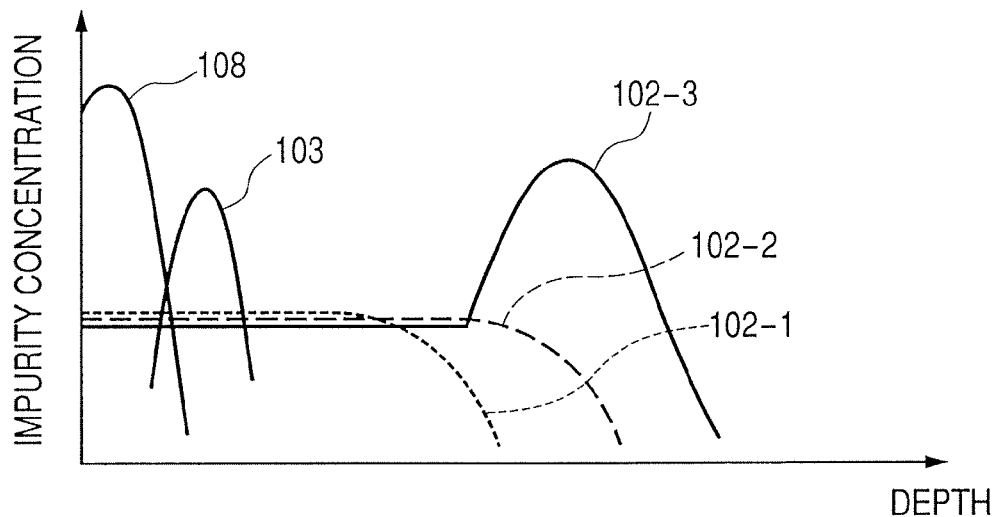
FIG. 11 is a concentration profile along the line Y-Y in FIG. 10.
Figure 12:
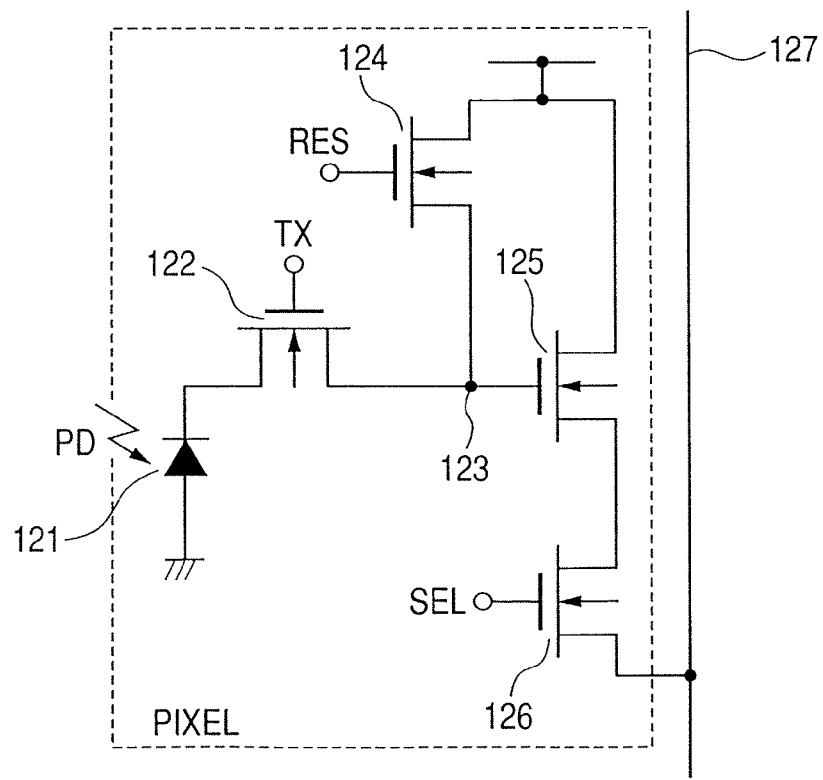
FIG. 12 is an equivalent circuit diagram of a pixel used for FIG. 9.

Particularly as shown in FIG. 11, in the case of the PWL concentration profile $PWL_3$ 102-3 (concentration profile is deeper than a conventional one or a concentration peak is present at a deep position (little grade well structure)), the path 3 is greatly restrained. Therefore, the number of cases in which electrons which must originally flow through the path 3 flows through the path 4 is increased. However, it is possible to greatly restrain the path 4 by a configuration having not only the structure (1) but also the structure of (2).

Figure 13:
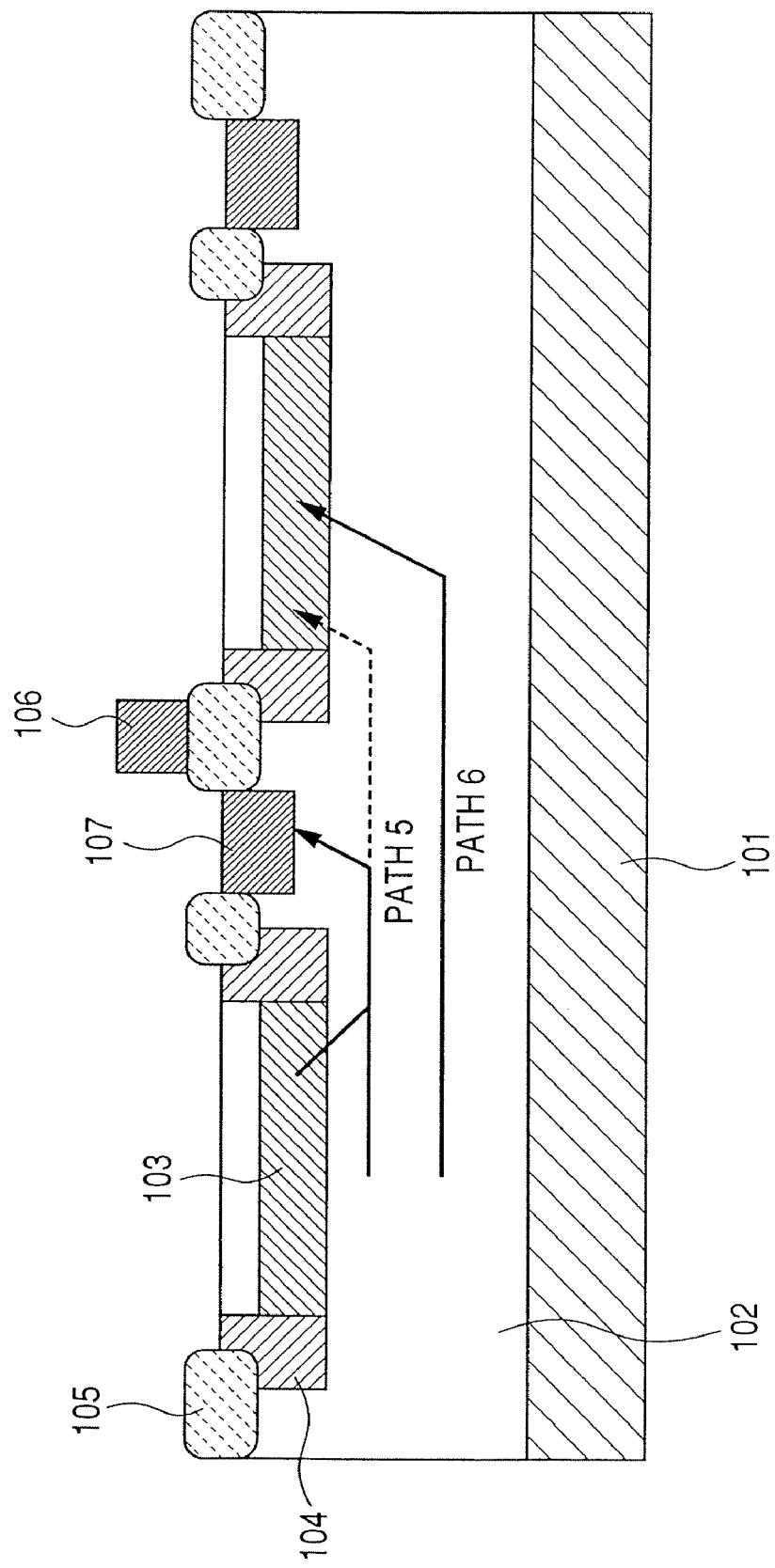
FIG. 13 is a sectional structural view (i) of a pixel for explaining a problem of a prior art.
Figure 14:
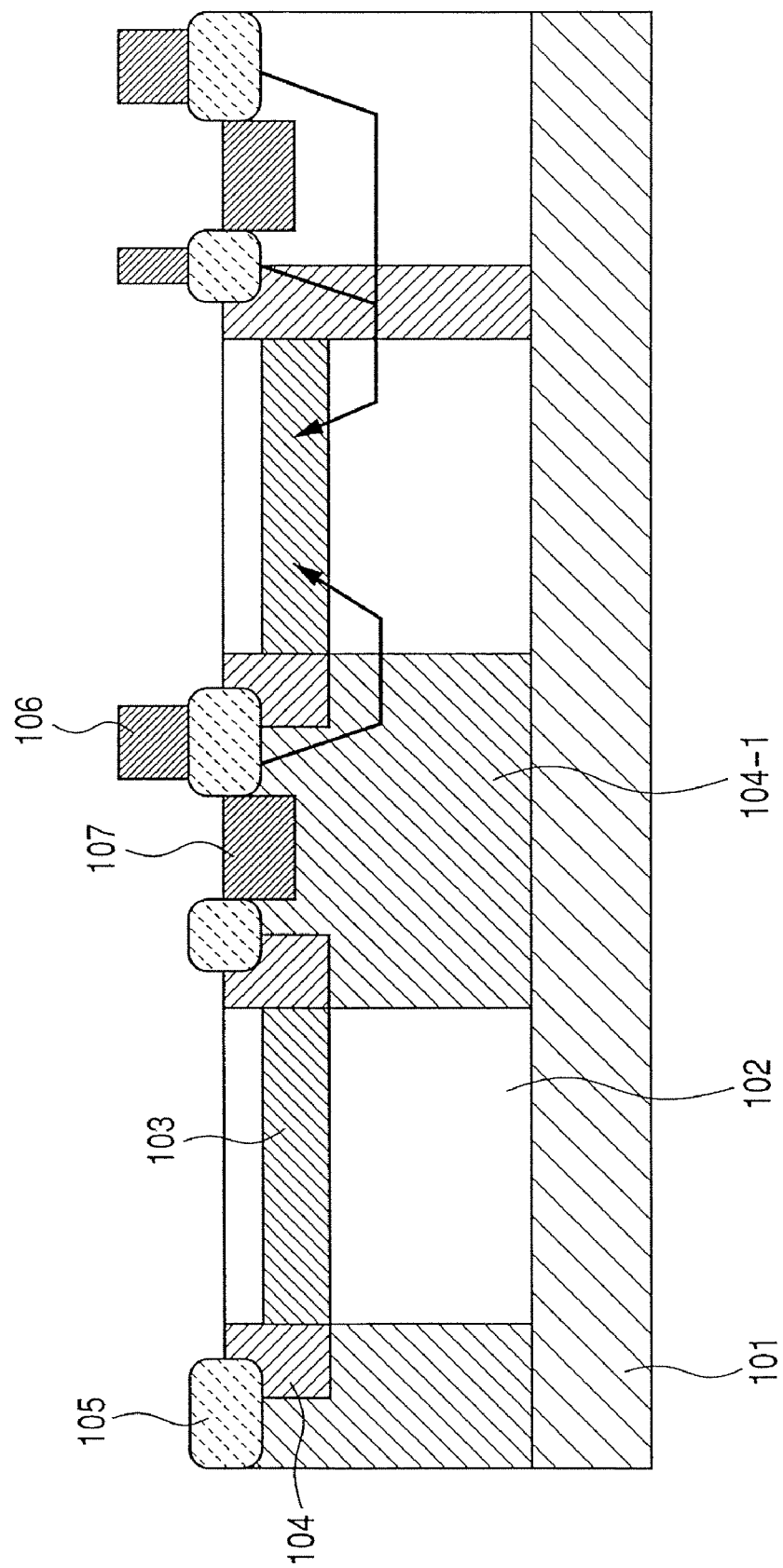
FIG. 14 is a sectional structural view (ii) of a pixel for explaining a problem of a prior art.

FIGS. 13 and 14 are sectional structural views (i) and (ii) of pixels for explaining problems of a prior art.

As shown in FIG. 14, unless an N+ region is formed in a device separation portion at the right side of the right pixel, the rate of electrons which finally flow into the N region 103 of a photodiode increases. Moreover, even if the P-type semiconductor region at the center of FIG. 14 is set like 104-1, it is impossible to prevent flowing into the N region 103 of the photodiode because there is no sealing effect though there is a certain effect.

Then, a phenomenon in which the number of charges leaking from adjacent pixels is increased is described below by referring to FIGS. 13 and 14.

In the case of a shallow PWL structure, it is not necessary to consider the path 6 in FIG. 13 but the path 5 is mainly considered. Because the path 5 is attracted into an N+ region by setting the N+ region, the blooming phenomenon and color mixture are very small.

However, by using a deep PWL structure, a rate at which the path 6 is formed increases. Particularly, by using the structure of the $PWL_3$ 102-3 in FIG. 11, a path of dark current to the N-type substrate 101 is restrained because there is a concentration barrier. Therefore, charges flowing into adjacent pixels by passing through the path 6 increases. In the case of the above structure of (1), the P-type semiconductor region serves as a concentration barrier (potential barrier) when charges flow into adjacent pixels to restrain leak of the charges into adjacent pixels. Description is made below by referring to FIG. 14. In the case of the structure shown at the central portion of FIG. 14, the versatility for setting a concentration is lowered because a MOS transistor also serves as a well through the P-type semiconductor region 104-1 has the function of restraining charges from flowing into adjacent pixels.

However, to leak into adjacent pixels by a structure in which a P well for providing a channel unit of a MOS transistor for forming pixels is held by the P-type semiconductor regions 204, it is necessary to exceed two concentration barriers. Moreover, before exceeding the concentration barriers (potential barriers) of the P-type semiconductor region 204 of adjacent pixels, the frequency of exceeding the concentration barriers (potential barriers) of the P-type semiconductor 204 is greatly restrained because the N+ region 107 is present and dark current is absorbed into the N+ region 107. In this case, source-drain region of a transistor is formed and the impurity concentration of a P well for providing the channel region of the source-drain region is set to a low value compared to that of the P-type semiconductor region.

Embodiment 2

Figure 3:
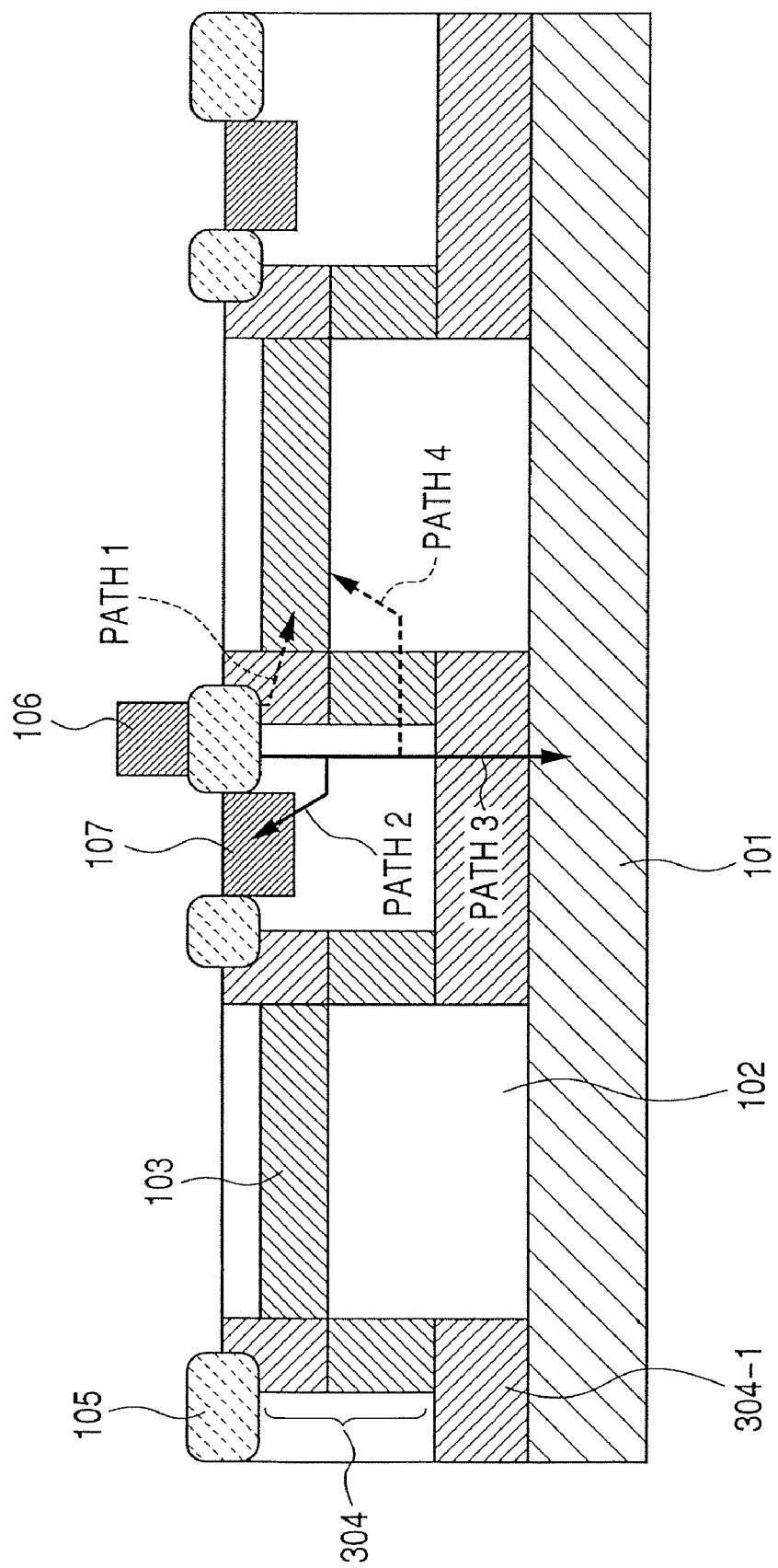
FIG. 3 is a sectional structural view of pixels of an image pickup device of Embodiment 2 of the present invention.

FIG. 3 is a sectional structural view of a pixel of an image pickup device of Embodiment 2.

The structure shown in FIG. 3 has a P-type semiconductor region 304-1 set over the lower portion of a MOS transistor in an adjacent photoelectric conversion unit under a P-type semiconductor region 304. In the case of the P-type semiconductor region 304-1, a concentration is set separately from the well of the MOS transistor and it is possible to form a high concentration barrier (potential barrier). It is possible to accelerate discharge of a few charges exceeding the concentration barrier (potential barrier) to the N+ region 107 and further restrain the charges from leaking into adjacent pixels by optimizing the concentration profile of the P-type semiconductor region 304-1.

Embodiment 3

Figure 4:
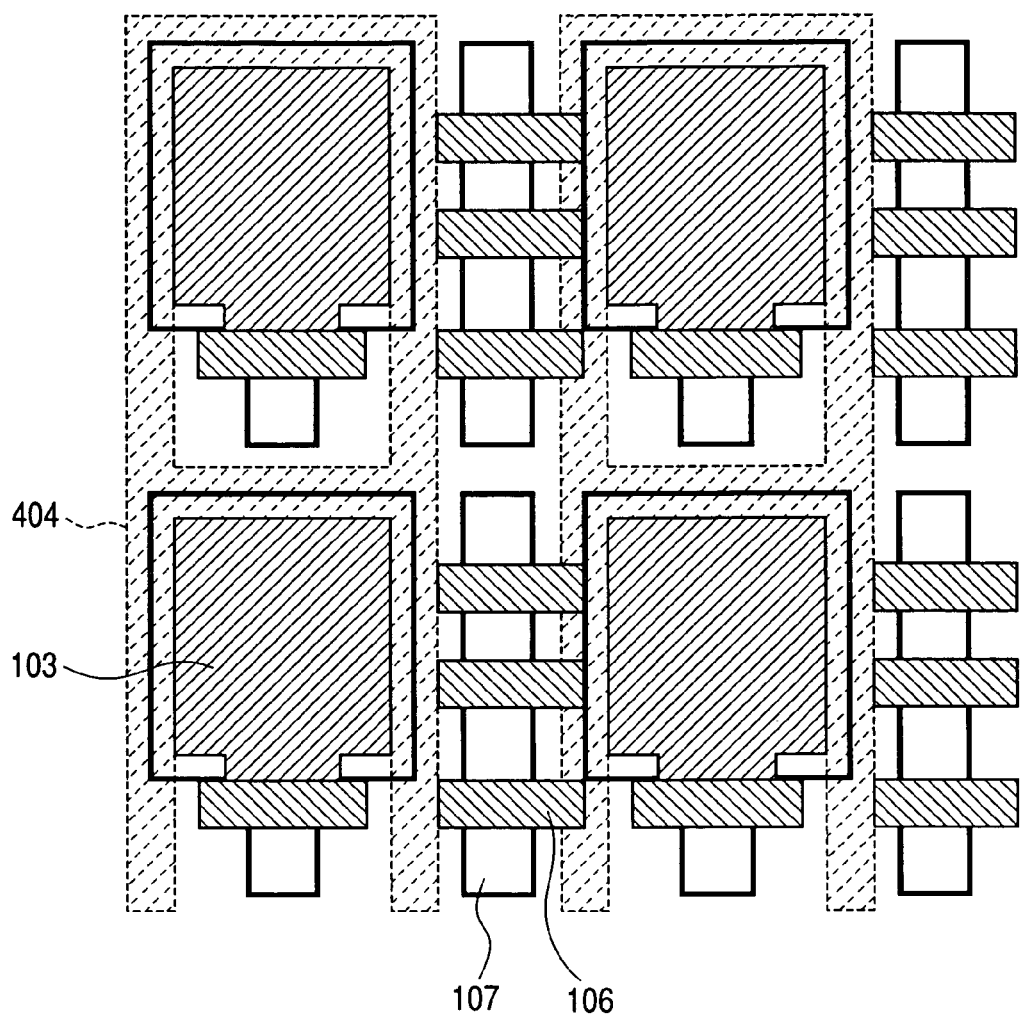
FIG. 4 is a top layout view of pixels of an image pickup device of Embodiment 3 of the present invention.

FIG. 4 is a top layout view of pixels of an image pickup device of Embodiment 3.

As shown in FIG. 4, by forming a P-type semiconductor region 404 into an annular shape and setting the region so that a photoelectric conversion unit and charge voltage conversion unit (FD) are included in the region, it is possible to provide an image pickup device in which dark current, blooming and color mixture are further restrained.

Figure 5:
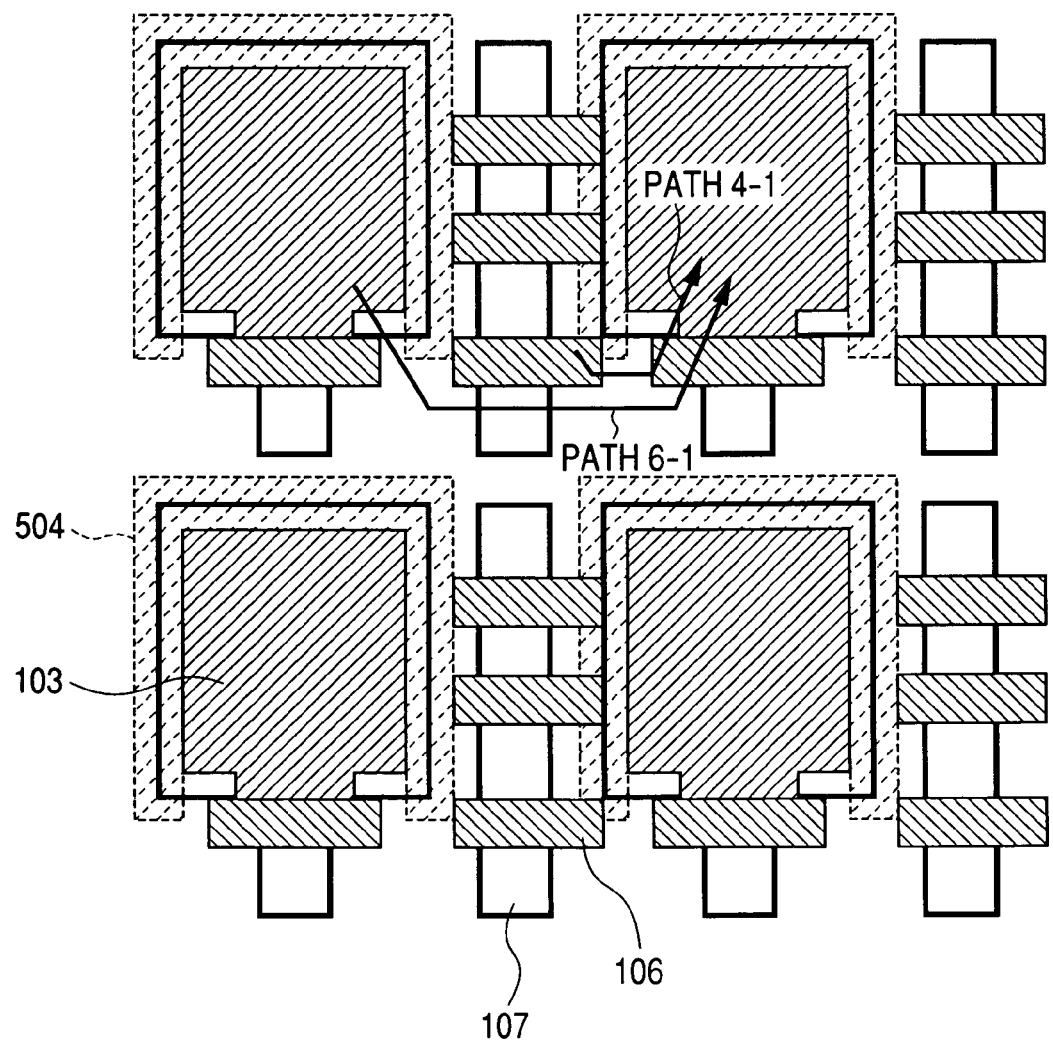
FIG. 5 is an illustration showing paths in which dark current, color mixture and blooming occur.

FIG. 5 is an illustration showing paths generated due to dark current, color mixture and blooming.

As shown in FIG. 5, when setting a P-type semiconductor region 504 as described above, paths 4-1 and 6-1 are left and a slight dark current, blooming and color mixture are left. However, by using the structure shown in FIG. 4, the paths 4-1 and 6-1 are restrained by the P-type semiconductor region 404 and it is possible to use the structure as a discharge destination of excessive charges and dark-current charges by setting a charge voltage conversion unit (FD) in a region covered with the P-type semiconductor region 404. Moreover, by setting this portion to a fixed voltage during a storage period, it is possible to discharge many charges. When there is no discharge port, paths are restrained by a concentration barrier (potential barrier). However, when charges are excessively generated, they exceed the concentration barrier and flow into adjacent pixels. By setting the discharge port, excessive charges are discharged and it is possible to greatly restrain the paths 4-1 and 6-1.

That is, it is important for the present invention to set not only a concentration barrier but also a charge discharge port and use a structure in which excessive charges easily flow into the discharge port.

EXAMPLE 1

This example has a configuration in which a photoelectric conversion unit and an amplifying unit are set in the same PWL.

Figure 6A:
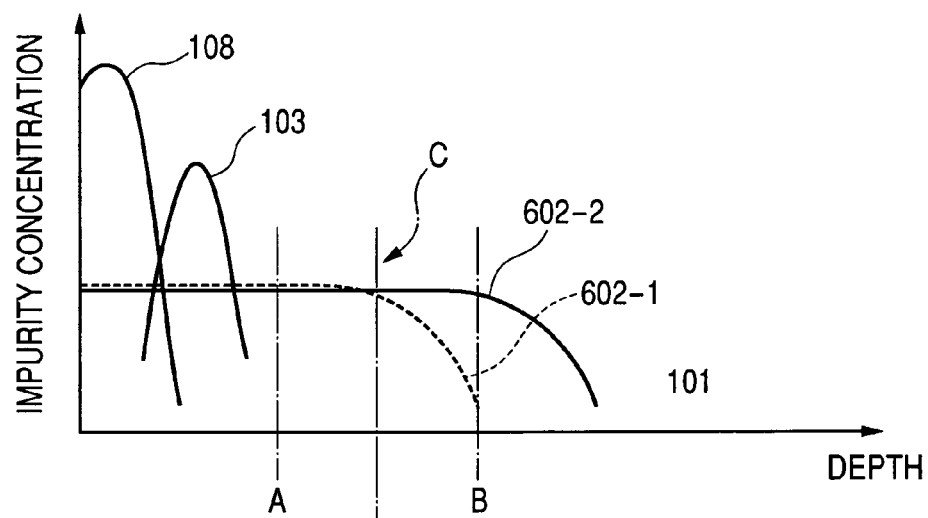
FIGS. 6A and 6B are concentration profiles of a PWL of the Embodiment 1.
Figure 6B:
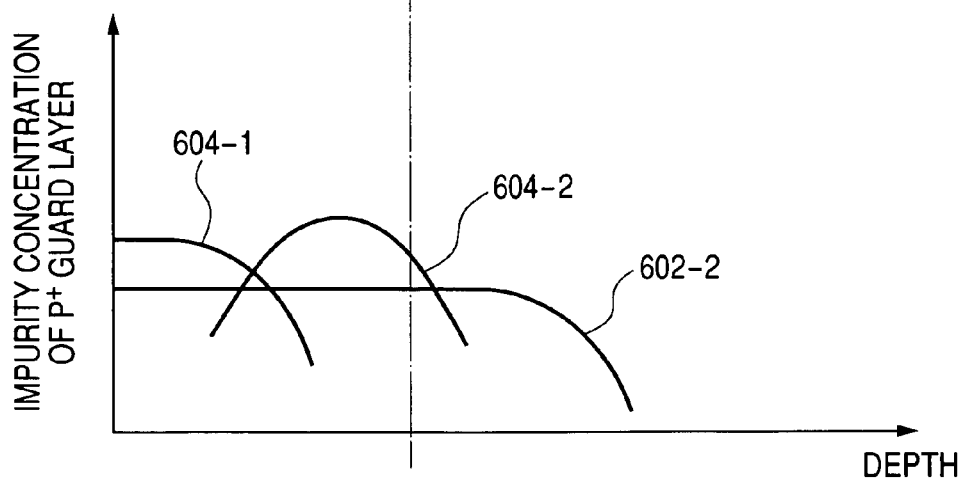

FIGS. 6A and 6B are concentration profiles of PWLs of this example.

The middle-concentration profile $PWL_1$ 602-1 in FIG. 6A has a conventional PWL structure and the $PWL_2$ 602-2 in FIG. 6A has a PWL structure of this example. By deepening the structure compared to a conventional well structure, it is possible to capture charges generated in a deeper portion by a PD and thereby improve sensitivity.

A problem of dark current or color mixture influences a performance like the present invention in the case of a visible-light sensor mounted on a digital camera or video. The visible-light sensor is designed by putting weight on the visual sensitivity of a person and preferably, the peak of a spectral sensitivity in a semiconductor layer is set so that a wavelength becomes equal to approx. 550 nm. That is, it is ideal that the optical signal divide shown in FIG. 6A becomes approx. 4 μm.

Therefore, the present invention is particularly effective for a visible-light sensor because of its performance, the depth of a PWL is ideally 4 μm and a range of 1 to 6 μm is a target of its substantial scope.

FIG. 6B is a concentration profile a P-type semiconductor region formed under a device separation region which is a characteristic requirement of the present invention. Because a PWL structure becomes deep, a first P-type semiconductor region 604-1 does not reach the "boundary depth (optical signal divide) in which optical charges flow to the N region 103 shown in FIG. 6C. Therefore, in the case of this example, a second P-type semiconductor region 604-2 is formed.

To extend the first P-type semiconductor region up to "C", spread in the horizontal direction becomes a problem and it is difficult to miniaturize pixels. The N region of a PD is substantially decreased by the influence of the horizontal spread. Therefore, in the case of this example, a second P-type semiconductor region is formed by ion implantation energy different from formation of the first P-type semiconductor region at a position deeper than the first P-type semiconductor region.

As a result, dark current is improved at ratios shown in the following Table 1.

TABLE 1

| PWL structure | First P+ guard layer | Second P+ guard layer | Dark current (Ratio) |
|---|---|---|---|
| $PWL_1$ | Present | Absent | 1 |
| $PWL_2$ | Present | Absent | 2 |
| $PWL_2$ | Present | Present | 1.2 |

Thus, according to this embodiment, by deepening a PWL and thereby increasing the number of carriers which can be captured by a photodiode, it is possible to lower dark current up to a level almost equal to the case in which the PWL is shallow.

EXAMPLE 2

FIG. 7 is a sectional structural view of a pixel of an image pickup device of Example 2.

A case of forming a first P-type semiconductor region 704 and a second P-type semiconductor region 704-1 and a case of forming a first P-type semiconductor region 704 and a second P-type semiconductor region 704-1 and a third semiconductor region 704-2 in FIG. 7 are described below.

The feature of this example is that horizontal widths of the First P-type semiconductor region 704, second P-type semiconductor region 704-1 and third P-type semiconductor region 704-2 are kept in a relation of 704<704-1<704-2. Preferably, the second P-type semiconductor region reaches "C" as described for the Example 1. However, even if the second P-type semiconductor region does not reach "C", a characteristic is effectively improved by forming the second P-type semiconductor region in a process (including a different ion implanting condition) separate from the case of the first P-type semiconductor region. The P-type semiconductor region 704 serving as the first P-type semiconductor region contacts with the N region of a MOS transistor or PD. Therefore, the horizontal width and the concentration of the region 704 are restricted and thereby, it is impossible to take the width and concentration sufficiently largely.

Compared to the case of extending the first P-type semiconductor region 704 in the state having the above restriction in a deep direction, the second P-type semiconductor region 704-1 is formed separately from the first P-type semiconductor region 704 (formed in a separate process). Thereby, it is possible to set a concentration and a width without deteriorating the performance of the above-described MOS transistor or photodiode. That is, it is possible to set the concentration of the second P-type semiconductor region 704-1 highly than the concentration of the P-type semiconductor region 704 and the horizontal width of the region 704-1 widely than the horizontal width of the region 704. A width can be widened by using a separate mask and thereby forming a semiconductor region. Moreover, when using the same mask as the case of the first P-type semiconductor region 704, it is enough to form the second P-type semiconductor region 704-1 by using a diagonal ion implantation method.

As a result, dark current and color mixture rate are improved at the ratios shown in Table 2.

TABLE 2

| PWL structure | 704 | 704-1 | 704-2 | Dark current (Ratio) | Color mixture rate |
|---|---|---|---|---|---|
| $PWL_1$ | Present | Absent | Absent | 1 | 0.5% |
| $PWL_2$ | Present | Absent | Absent | 2 | 1.5% |
| $PWL_2$ | Present | Present | Absent | 1.1 | 0.5% |
| $PWL_2$ | Present | Present | Present | 0.7 | 0.2% |

Moreover, it is preferable that the third P-type semiconductor region 704-2 is also set under an amplifying unit. Furthermore, the region 704-2 extends up to a part of the lower portion of the N region of a PD.

This example has a structure capable of setting optical charges present at a deep position to the N region 103 of the PD and correctly capturing or discharging charges not used for forming an image of dark current or color mixture charge from or to the N+ region 107. Moreover, the structure is preferable from the viewpoint of fabrication. That is, when forming a P-type semiconductor region at a deep position and using it as a barrier, it is necessary to implant ions at a high energy. In this case, however, it is necessary to thicken a resist. As a result, a resolution capacity is inevitably deteriorated and fine resolution is difficult. By using the structure of this example, it is possible to avoid the above problem of fabrication.

The effect is confirmed even by the structure shown in FIG. 3. That is, it is possible to sufficiently obtain the effect of even the structure in FIG. 3. However, as described above, by applying the structure in FIG. 7, it is possible to obtain a larger effect. Moreover, it is possible to widen its scope.

EXAMPLE 3

Figure 8A:
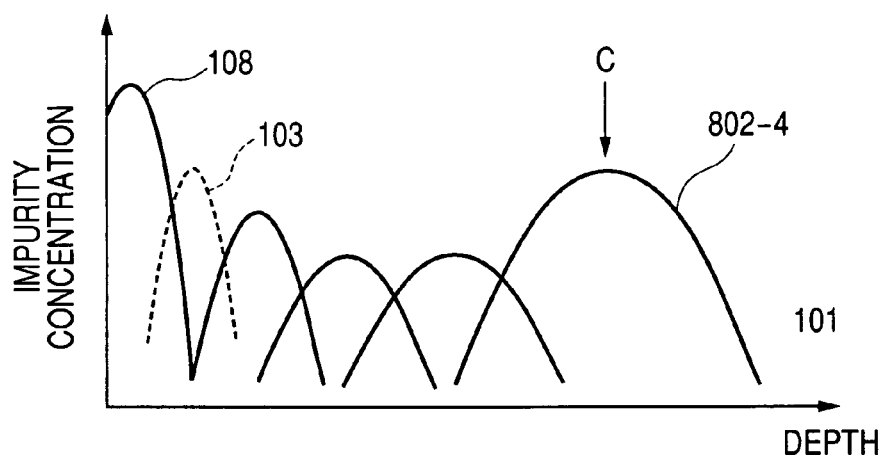
FIGS. 8A, 8B and 8C are concentration profiles of a PWL and P+ guard layer of Embodiment 3.
Figure 8B:
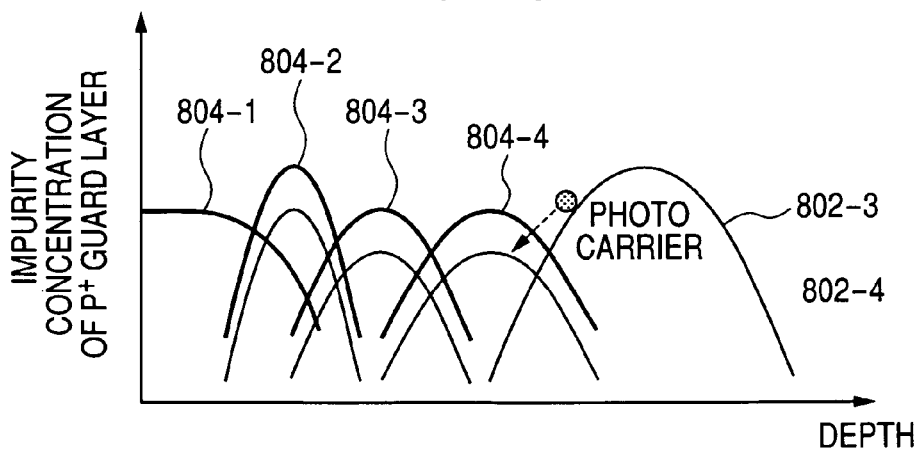
Figure 8C:
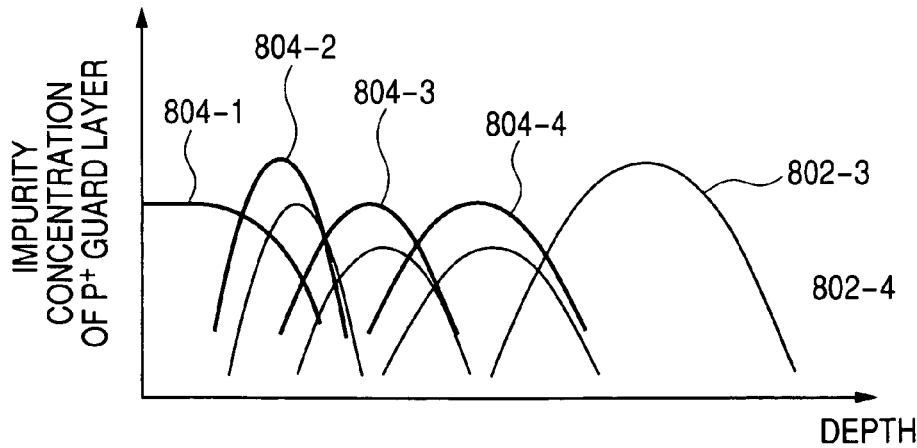
Figure 9:
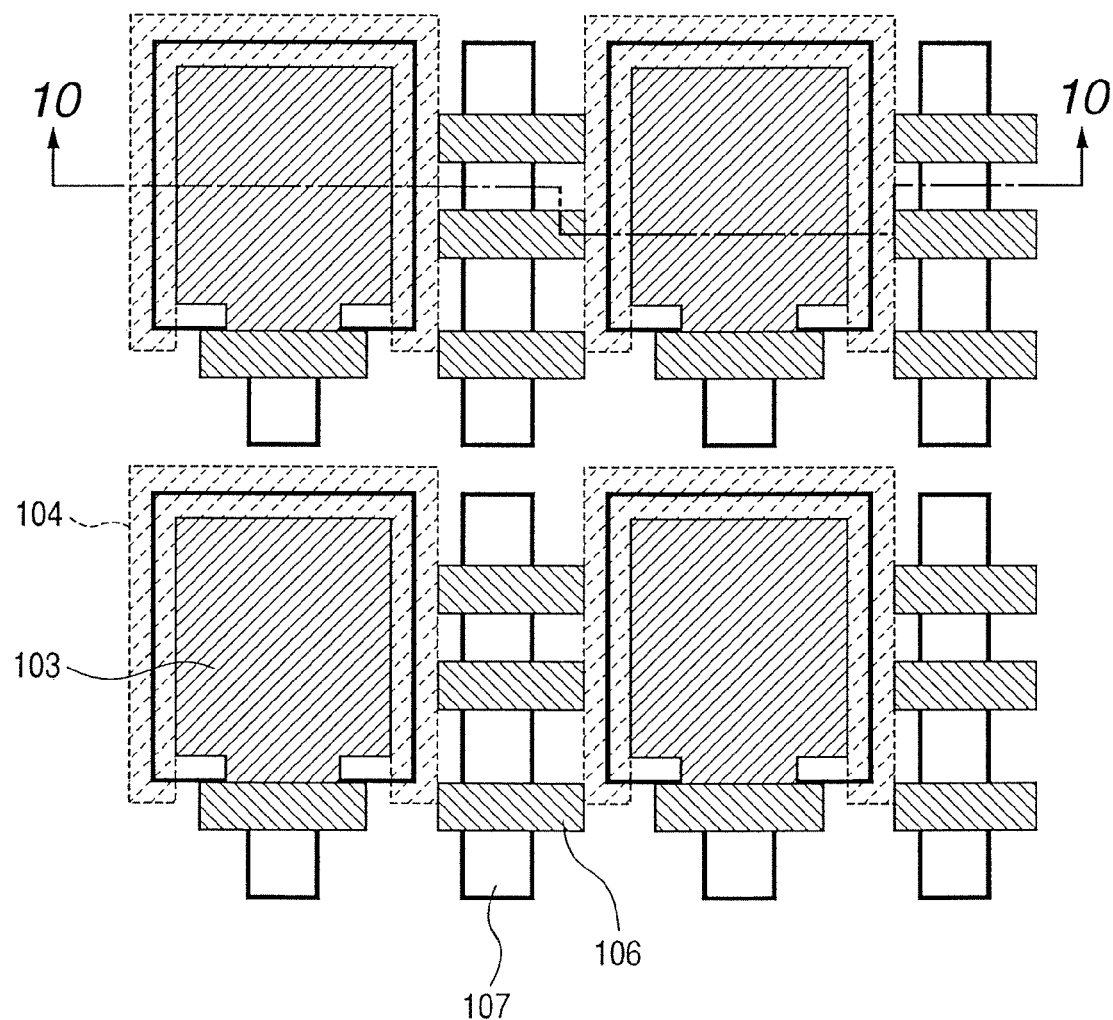
FIG. 9 is a top layout view of pixels of an image pickup device of a prior art.

FIGS. 8A to 8C are concentration profile diagrams of a P-type semiconductor region functioning as a barrier to a signal charge, formed between N+ regions present between photoelectric conversion units adjacent to a PWL and a photoelectric conversion unit of Example 3.

FIG. 8A shows a concentration profile of the PWL structure of this example. The PWL is fabricated by repeatedly implanting a plurality of ions having energies different from each other. $PWL_3$ 802-3 and $PWL_4$ 802-4 are formed of a plurality of wells (semiconductor regions) respectively having an impurity concentration peak.

FIG. 8B shows a concentration profile of a P-type semiconductor region functioning as a barrier. The profiles are formed in accordance with the implanting energy condition same as the case of the PWL. The fabrication process is formed in accordance with the LOCOS method in order to form a separation layer after implanting ions into the PWL and P-type semiconductor region. Reference numerals 804-1 to 804-4 show first to fourth P-type semiconductor regions. A thin line in FIG. 8B shows the 802-4 $PWL_4$ in FIG. 8A.

The concentration profiles in FIG. 8C are obtained by forming a separation layer by the LOCOS method and then, implanting ions into a PWL and P-type semiconductor region though an implanting energy condition same as that in FIG. 8B is used. In any case, a preferable characteristic is obtained in which dark current, blooming and color mixture are greatly restrained. Particularly in FIG. 8C, in profiles of PWLs, an extreme value is present in concentration and it is possible to raise a concentration barrier of a minimum value portion in which charges easily stay.

Moreover, in the case of this example, the fourth P-type semiconductor region 804-4 does not reach an optical-signal divide. However, as shown in FIGS. 8A to 8C, optical charges generated in a region in which a P-type semiconductor region is insufficient immediately flow into a PWL having a low concentration because of their concentration gradient. Therefore, leak to adjacent pixels at this portion is sufficiently small and it is possible to confirm that even the structure shown for this example has a sufficient restrain effect.

This example has one more characteristic. By forming a PWL and a P-type semiconductor region in accordance with a plurality of ion implantation steps, it is possible to select a proper concentration at each depth and derive a higher sensor performance. Specifically, a P-type impurity region having a high concentration present at the lower portion of the N region 103 of the photodiode in FIG. 8A is used. It is preferable that the impurity region has a concentration of 5E16 $cm^{-3}$ or more in order to obtain a large handling charge value. Moreover, it is preferable that a P-type impurity region located at the deepest position has a concentration of 1E17 $cm^{-3}$ or more in order to improve the sensitivity. Moreover, it is preferable that a P-type impurity region present between them has a concentration of ⅕ to 1/10 in order to flow signal charges into a PD compared to the concentration of a P-type impurity region located as the deepest position.

Moreover, to improve the sensor performance, it is preferable to similarly design a P-type semiconductor region correspondingly to a designed PWL structure. Setting second and third P-type semiconductor regions independently of the first P-type semiconductor region like the case of this example is particularly effective for improvement of the performance of a sensor having a plurality of wells respectively having an impurity concentration peak and formed at different depths. In this case, the PWL and the P-type semiconductor region functioning as a barrier are formed at almost the same depth.

An approximate value of each concentration is described by referring to FIGS. 8A to 8C. In FIGS. 8A to 8C, PWLs have surface concentrations of 1E16 to 3E17 $cm^{-3}$ because it is necessary to be coexistence with a transistor. The concentration of a PWL at the deepest position is up to 1E18 $cm^{-3}$ and an intermediate PWL has a concentration smaller than that of the PWL at the deepest position, preferably ½ or less. A trend of improvement is obtained when the concentration is not ½ or less. The above structure makes it possible to more efficiently collect optical charges in a PD. Moreover, the guard region is preferably more effective when the region has a concentration two times or more higher than that of each PWL. However, by raising a concentration, a trend of improvement is obtained.

EXAMPLE 4

This example corresponds to the Embodiment 3 in FIG. 4.

A concentration profile is prepared in the same condition as that in FIG. 8C.

As a result, dark current and the like are improved at ratios shown in Table 3.

TABLE 3

| Pixel layout | Deep guard layer | Dark current (Ratio) | Color mixture rate | Blooming quantity (Ratio) |
|---|---|---|---|---|
| Layout in FIG. 1 | Absent | 3 | 2% | 3 |
| Layout in FIG. 1 | Present | 0.7 | 0.2% | 1 |
| Layout in FIG. 3 | Present | 0.6 | 0.1% | 0.5 |

In the case of this example, by using the pixel layout shown in FIG. 4, it is possible to get the paths shown in FIG. 5 under control and further improve the sensor characteristic compared to a pixel having the deep P-type semiconductor region in FIG. 1. The deep P-type semiconductor region shown in the table is at least one of 804-2 to 804-4 formed in ion implantation steps of a plurality of times.

[Application to a Camera Body]

Figure 15:
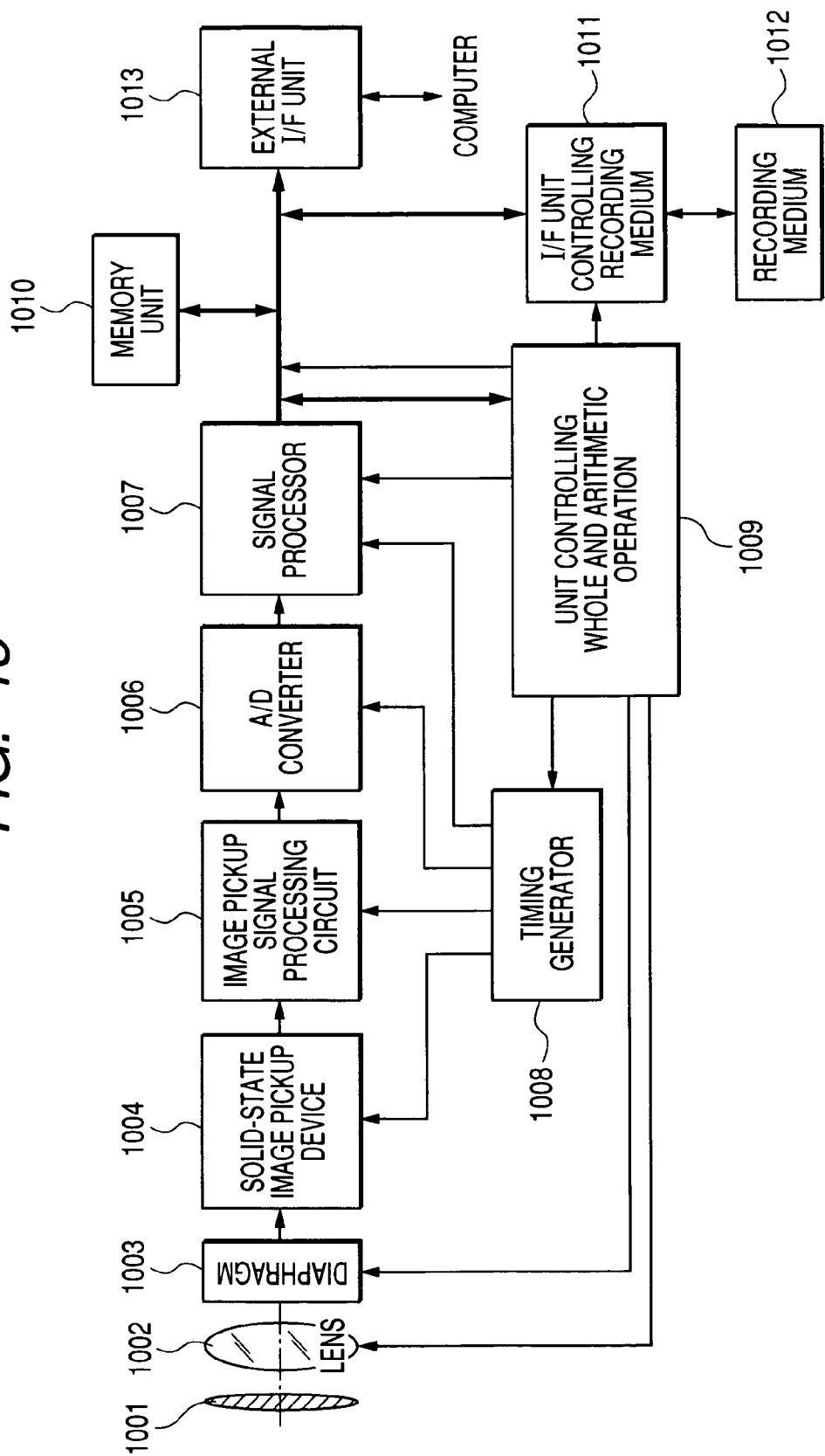
FIG. 15 is an illustration showing a circuit block when applying an image pickup device of the present invention to a camera.

FIG. 15 is an illustration showing a circuit block when applying an image pickup device of the present invention to a camera.

There is a shutter 1001 before a photographing lens 1002 to control exposure. A light intensity is controlled by a diaphragm 1003 according to necessity to image an object on an image pickup device 1004. A signal output from the image pickup device 1004 is processed by an image pickup signal processing circuit 1005 and converted from an analog signal into a digital signal by an A/D converter 1006. The output digital signal is further arithmetic-processed by a signal processing unit 1007. The processed digital signal is stored in a memory unit 1010 and sent to an external unit through an external I/F unit 1013. The image pickup device 1004, image-pickup signal processing circuit 1005, A/D converter 1006 and signal processing unit 1007 are controlled by a timing generation unit 1008 and the whole system is controlled by a whole-control unit and arithmetic-operation unit 1009. To record an image in a recording medium 1012, an output digital signal is recorded through a recording-medium control I/F unit 1011 controlled by the whole-control unit and arithmetic operation unit.

EXAMPLE 5

The effect described for the Example 3 is more minutely described below by using the present example.

Figure 16A:
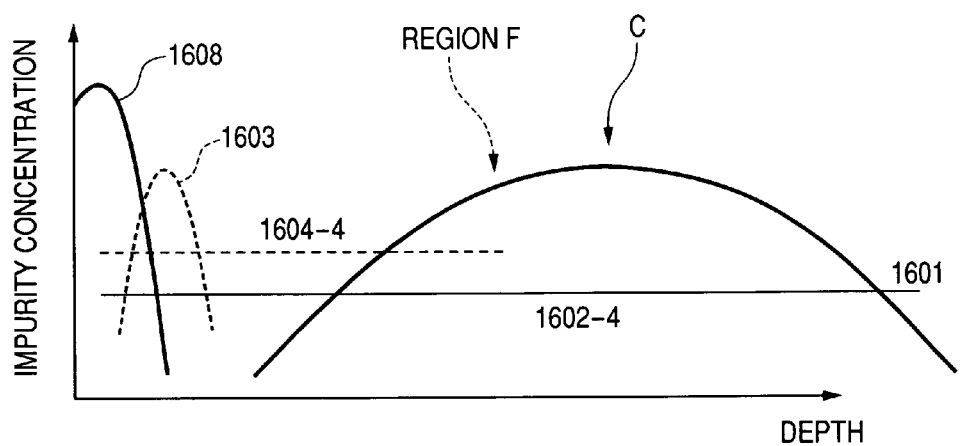
FIGS. 16A, 16B and 16C are concentration profiles of a PWL and P+ guard layer of Embodiment 5.
Figure 16B:
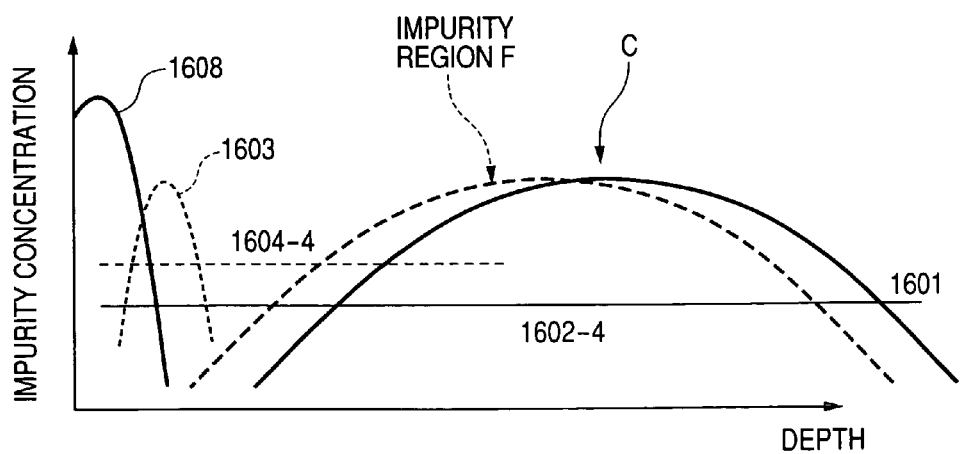
Figure 16C:
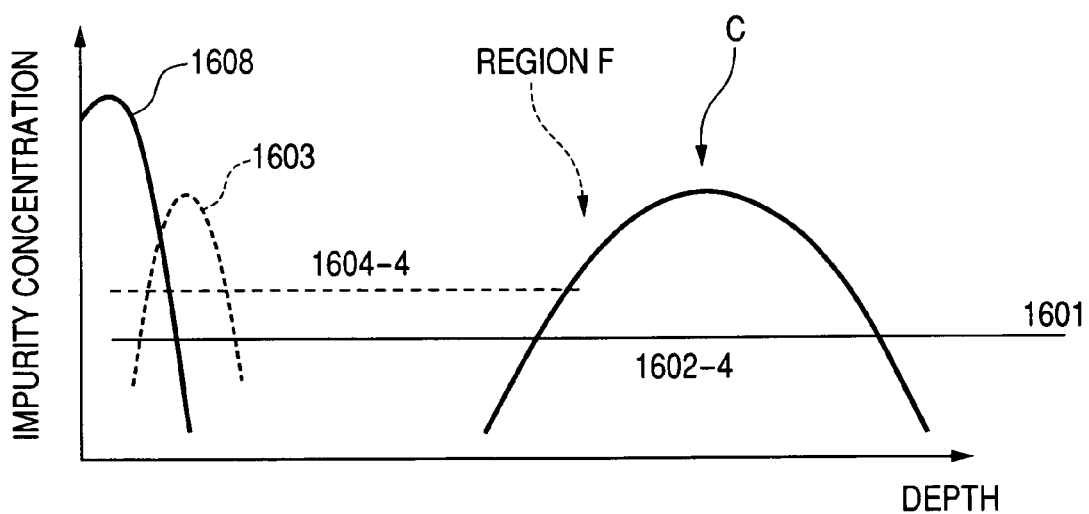

FIGS. 16A to 16C are illustrations for explaining this example. In the case of this example, the concentration profile of a deep guard ring is described. A reference numeral 1608 denotes p+region. A reference numeral 1603 denotes N type region forming a photodiode. A reference numeral 1604-4 denotes a concentration profile of a guard ring. A reference numeral 1601 denotes a concentration profile under a photodiode.

Optical charges generated at a deep position by incoming light almost isotropically expand by diffusion transport when a concentration is unlimitedly uniform. That is, because the generated optical charges are excessive charges, they isotropically expand in order to uniform the excessive carriers. In fact, however, the photodiode side is depleted due to the PN junction of the photodiode and an electron concentration is low. Therefore, the current quantity by diffusion transport is increased due to the electron concentration difference. Therefore, most optical carriers reach the photodiode but several % of them leaks to adjacent pixels. To restrain the leak of them, it is necessary to make optical carriers easily flow to the photodiode. Therefore, in the case of this example, a potential gradient is formed by providing a gradient to impurity concentrations so as to flow to the photodiode side by the electric field. Diffusion current is $D*[dn/dx]$, D is a diffusion constant, n is a carrier concentration, drift current is $\mu*n*E$, and E is an electric field.

Moreover, when considering that a general carrier generation quantity by light is up to 100,000 electrons/pixel/sec, a sufficient effect is obtained by setting an impurity concentration gradient of approx. one digit.

In this case, an important idea is shown in FIGS. 16A to 16C.

In FIGS. 16A to 16C, a continuous line 1601 shows a concentration profile under a photodiode and a broken line 1604-4 is a concentration profile of a guard ring of the present invention.

In the case of the structure in FIG. 16A, though color mixture is almost restrained, a small quantity flows into adjacent pixels through the region F.

To further restrain color mixture, it is necessary to deepen the guard ring up to the vicinity of the position C like FIG. 16B. To realize the above mentioned, it is necessary to perform ion-implantation to the guard ring at a high energy. That is, an advanced technique is necessary which requires resist having a large film thickness and minute patterning.

This example uses a structure in which concentration differences are concentrated on a deep position, a concentration gradient of an intermediate layer is decreased by a value equivalent to concentration of concentration differences, and color mixture in the region is restrained by a deep guard ring like FIG. 16C.

That is, the concentration profile of the photodiode is roughly divided into three regions as shown below.

<1> Deep region having a large concentration gradient (Preferably, 1 digit/1.5 μm)
<2> Intermediate region having no concentration gradient or a small concentration gradient
<3> Shallow region in which photodiode is present As a result, diffusion in cross direction is restrained by a potential gradient at a deep portion and an intermediate layer can restrain color mixture by a guard ring. Specifically, C is set to 3.5 μm and formed through ion implantation at approx. 2.5 MeV of boron, and a peak concentration is set to approx. $2e17 \text{ cm}^{-3}$. An intermediate region is realized at a position of approx. 2 μm and a deep guard ring is formed through ion implantation of approx. 1.5 MeV of boron.

As a result, a high color-mixture restraining force can be obtained by applying comparatively easy middle-degree ion implantation to the deep guard ring.

Then, in the case of the concentration of a guard ring in an intermediate region, it is possible to restrain up to color mixture of approx. 1% or less by having a concentration at least approx. 5 times, preferably 10 times higher for a width of 1 μm of the guard ring to the concentration under a photodiode. Particularly as one characteristic of a deep guard ring of the present invention, a wide guard ring region is formed. This deep guard ring can be set under a MOS transistor serving as a surface device. This is because a higher restraint effect can be obtained when the deep guard ring has the same concentration as a conventional shallow-position guard ring and it is possible to restrain a concentration in order to restrain a damage to a white defect or transistor for the same restraint effect.

Figure 17:
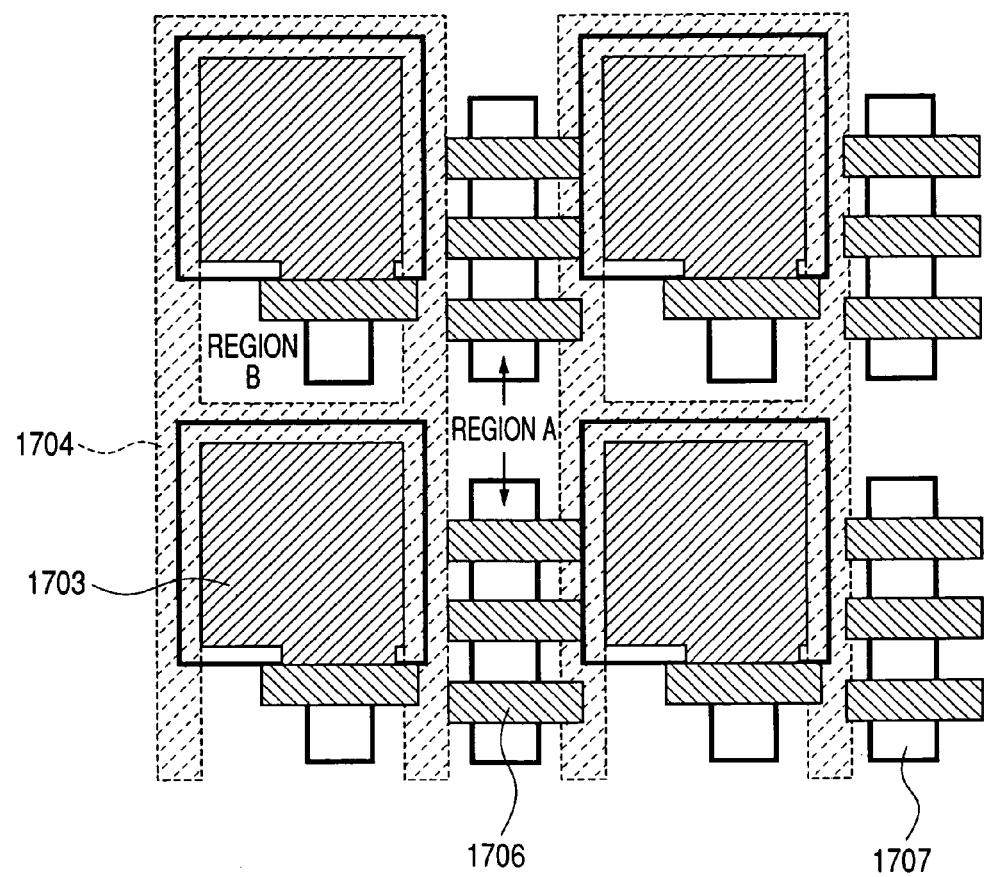
FIG. 17 is a top layout view of pixels of an image pickup device of Embodiment 5 of the present invention.

It is important for the present invention that a higher color-mixture restraint effect can be obtained by forming a deep guard ring under a MOS transistor or electrode. However, the electrode is not indispensable as a sectional structure but it is enough that an N+ electrode is set to a part of the sectional structure. Only setting a wide guard ring provides a color-mixture prevention effect. As shown in FIG. 17, though a region A or region B is a region where an electrode of a MOS transistor is not formed, a color-mixture prevention effect by the present invention is sufficiently obtained by setting a wide deep guard ring under the region. When an N+ electrode is formed even at a part of the deep guard ring region, carriers causing color mixture can finally flow to the electrode. A reference numeral 1703 denotes N type region forming a photodiode. A reference numeral 1704-4 denotes a concentration profile of a guard ring. A reference numeral 1706 denotes a poly silicon wiring. A reference numeral 1707 denotes n+ region of the MOS transistor.

This application claims priority from Japanese Patent Application No. 2004-168575 filed on Jun. 7, 2004, which is hereby incorporated by reference herein.

What is claimed is:

1. An amplifying type image pickup device, comprising a plurality of pixels, wherein each pixel includes:
   a photoelectric conversion unit for converting incident light into a signal carrier;
   a floating diffusion portion, arranged adjacent to the photoelectric conversion unit so as to sandwich a portion of a transfer transistor between the floating diffusion portion and the photoelectric conversion unit, for converting the signal carrier generated by the photoelectric conversion unit into a signal voltage;
   an amplification transistor, having a gate connected to the floating diffusion portion, for outputting an amplified signal based on the signal voltage;
   a well of a second conductivity type arranged on a semiconductor substrate of a first conductivity type;
   a first semiconductor region of the first conductivity type, capable of accumulating the signal carrier, arranged in the well of the second conductivity type and constituting a part of the photoelectric conversion unit;
   a second semiconductor region of the first conductivity type, arranged in the well of the second conductivity type, operating as a source region or a drain region of the amplification transistor;
   an element isolation region arranged between the first and second semiconductor regions; and
   a guard region portion of the second conductivity type arranged under the element isolation region, the guard region portion including a plurality of semiconductor regions of the second conductivity type respectively at different depths, having an impurity concentration higher than that of the well of the second conductivity type, and extending to reach the semiconductor substrate,
   wherein the guard region portion of the second conductivity type surrounds the first semiconductor region and the floating diffusion portion of the pixel, and the second semiconductor region is sandwiched between a guard region included in a first pixel and a guard region included in a second pixel adjacent to the first pixel, so that the well remains under the second semiconductor region.

2. The image pickup device of claim 1, wherein the guard region portion is part of a guard region of the second conductivity type, such that a deepest portion of the guard region of the second conductivity type is arranged under the second semiconductor region and between photoelectric conversion units of mutually adjacent first and second pixels.

3. The image pickup device of claim 1, wherein the plurality of semiconductor regions included in the guard region portion is arranged such that a width and an impurity concentration increases as a depth increases.

4. The image pickup device of claim 1, wherein the well includes a plurality of wells having impurity peaks.

5. A camera comprising:
   an image pickup device that includes a plurality of pixels, wherein each pixel includes:
      a photoelectric conversion unit for converting incident light into a signal carrier,
      a floating diffusion portion, arranged adjacent to the photoelectric conversion unit so as to sandwich a portion of a transfer transistor between the floating diffusion portion and the photoelectric conversion unit, for converting the signal carrier generated by the photoelectric conversion unit into a signal voltage,
      an amplification transistor, having a gate connected to the floating diffusion portion, for outputting an amplified signal based on the signal voltage,
      a well of a second conductivity type arranged on a semiconductor substrate portion of a first conductivity type,
      a first semiconductor region of the first conductivity type, capable of accumulating the signal carrier, arranged in the well of the second conductivity type and constituting a part of the photoelectric conversion unit,
      a second semiconductor region of the first conductivity type, arranged in the well of the second conductivity type, operating as a source region or a drain region of the amplification transistor,
      an element isolation region arranged between the first and second semiconductor regions, and
      a guard region portion of the second conductivity type arranged under the element isolation region, the guard region portion including a plurality of semiconductor regions of the second conductivity type respectively at different depths having an impurity concentration higher than that of the well of the second conductivity type, and extending to reach the semiconductor substrate,
      wherein the guard region portion of the second conductivity type surrounds the first semiconductor region and the floating diffusion portion of the pixel, and the second semiconductor region is sandwiched between a guard region included in a first pixel and a guard region included in a second pixel adjacent to the first pixel, so that the well remains under the second semiconductor region;
   a signal processing circuit for processing a signal output from the image pickup device; and
   an optical member for imaging an object on a photoreceiving surface of the image pickup device.

* * * * *